(12) United States Patent
Cheng et al.

(10) Patent No.: US 8,169,022 B2
(45) Date of Patent: May 1, 2012

(54) VERTICAL JUNCTION FIELD EFFECT TRANSISTORS AND DIODES HAVING GRADED DOPED REGIONS AND METHODS OF MAKING

(75) Inventors: Lin Cheng, Chapel Hill, NC (US); Michael Mazzola, Starkville, MS (US)

(73) Assignee: SS SC IP, LLC, Jackson, MS (US)

( * ) Notice: Subject to any disclaimer, the term of this patent is extended or adjusted under 35 U.S.C. 154(b) by 130 days.

(21) Appl. No.: 12/818,232

(22) Filed: Jun. 18, 2010

(65) Prior Publication Data

US 2010/0320476 A1    Dec. 23, 2010

Related U.S. Application Data

(60) Provisional application No. 61/218,758, filed on Jun. 19, 2009.

(51) Int. Cl.
*H01L 29/66* (2006.01)
(52) U.S. Cl. ... 257/335; 257/77; 257/287; 257/E27.148; 257/E29.265; 257/E21.421; 438/192; 438/194; 438/186
(58) Field of Classification Search ............... 257/335, 257/77, 287, E27.148, E29.265, E21.421; 438/186, 194
See application file for complete search history.

(56) References Cited

U.S. PATENT DOCUMENTS

| | | |
|---|---|---|
| 6,078,090 A | 6/2000 | Williams et al. |
| 6,271,550 B1 | 8/2001 | Gehrmann |
| 6,313,482 B1 | 11/2001 | Baliga |
| 6,355,513 B1 | 3/2002 | Yu |
| 6,635,544 B2 | 10/2003 | Disney |
| 7,199,442 B2 | 4/2007 | Shenoy |
| 7,355,223 B2 | 4/2008 | Harris et al. |
| 2005/0067630 A1 | 3/2005 | Zhao |
| 2006/0011924 A1 | 1/2006 | Mazzola et al. |
| 2008/0124853 A1 | 5/2008 | Cheng et al. |

FOREIGN PATENT DOCUMENTS

WO   2006122252 A2   11/2006

OTHER PUBLICATIONS

Written Opinion of the International Searching Authority dated Jan. 25, 2011.
International Search Report dated Jan. 25, 2011.

*Primary Examiner* — Jarrett Stark
(74) *Attorney, Agent, or Firm* — Morris, Manning & Martin, LLP; Christopher W. Raimund (57) ABSTRACT

Semiconductor devices and methods of making the devices are described. The devices can be junction field-effect transistors (JFETs) or diodes such as junction barrier Schottky (JBS) diodes or PiN diodes. The devices have graded p-type semiconductor layers and/or regions formed by epitaxial growth. The methods do not require ion implantation. The devices can be made from a wide-bandgap semiconductor material such as silicon carbide (SiC) and can be used in high temperature and high power applications.

47 Claims, 3 Drawing Sheets

VERTICAL JUNCTION FIELD EFFECT TRANSISTORS AND DIODES HAVING GRADED DOPED REGIONS AND METHODS OF MAKING

This application claims the benefit of Provisional U.S. Patent Application Ser. No. 61/218,758, filed on Jun. 19, 2009, which is incorporated by reference herein in its entirety.

The section headings used herein are for organizational purposes only and should not be construed as limiting the subject matter described herein in any way.

BACKGROUND

1. Field

This application relates generally to semiconductor devices and to methods of making the devices.

2. Background of the Technology

A field-effect transistor (FET) is a type of transistor commonly used for weak-signal amplification (e.g., for amplifying wireless signals). The device can amplify analog or digital signals. It can also switch DC or function as an oscillator. In an FET, current flows along a semiconductor path called the channel. At one end of the channel, there is an electrode called the source. At the other end of the channel, there is an electrode called the drain. The physical diameter of the channel is fixed, but its effective electrical diameter can be varied by the application of a voltage to a control electrode called the gate. The conductivity of the FET depends, at any given instant in time, on the electrical diameter of the channel. A small change in gate voltage can cause a large variation in the current from the source to the drain thereby allowing for amplification of signals.

A PiN diode is a diode with a wide, lightly doped 'near' intrinsic semiconductor region between a p-type semiconductor and n-type semiconductor regions. A junction barrier Schottky (JBS) diode is also referred to as a merged PiN Schottky diode since it contains both PiN and Schottky barrier (i.e., metal-semiconductor) junctions.

Semiconductor devices such as FETs and PiN and JBS diodes are typically made using ion implantation techniques. Ion implantation, however, requires high temperature post implant anneals which increases the time required to manufacture the device and which can result in damage to the device.

Accordingly, there still exists a need for improved methods of making semiconductor devices such as FETs and PiN and JBS diodes which do not involve ion implantation.

SUMMARY

A semiconductor device is provided which comprises:
an n-type semiconductor substrate;
a drift layer of n-type semiconductor material on the substrate;
a plurality of gate regions of p-type semiconductor material each having a graded dopant concentration on the drift layer, the gate regions having a lower surface adjacent the drift layer, an upper surface opposite the lower surface and sidewalls, wherein the dopant concentration in a lower portion of the gate regions adjacent the lower surface is less than the dopant concentration in an upper portion of the gate regions adjacent the upper surface;
a channel layer of n-type semiconductor material on and between the plurality of gate regions in a central portion of the device, wherein the second layer of n-type semiconductor material covers the plurality of regions of p-type semiconductor material in the central portion of the device, and wherein one or more gate regions are not covered by the channel layer in an inner peripheral portion of the device;
a source layer of n-type semiconductor material on the channel layer;
a first ohmic contact on the source layer;
a second ohmic contact on one or more of the exposed gate regions in the peripheral portion of the device;
a third ohmic contact on the substrate opposite the drift layer; and
a metal layer on each of the first, second and third ohmic contacts.

A method of making a semiconductor device is also provided which comprises:
epitaxially growing a gate layer of p-type semiconductor material on a drift layer of n-type semiconductor material, wherein the gate layer has a lower surface adjacent the drift layer and an upper surface opposite the lower surface, wherein the dopant concentration in the gate layer is increased during epitaxial growth such that the dopant concentration in a lower portion of the gate layer adjacent the lower surface is less than the dopant concentration in an upper portion of the gate layer adjacent the upper surface, and wherein the drift layer is on an n-type semiconductor substrate;
etching through the gate layer to form a plurality of gate regions of p-type semiconductor material each having an upper surface and sidewalls;
depositing a channel layer of n-type semiconductor material between the gate regions in a central portion of the device, wherein the channel layer covers the plurality of regions of p-type semiconductor material in the central portion of the device, and wherein one or more gate regions of p-type semiconductor material are not covered by the channel layer in an inner peripheral portion of the device;
depositing a source layer of n-type semiconductor material on the channel layer;
forming a first ohmic contact on the source layer;
forming a second ohmic contact on one or more gate regions in the inner peripheral portion of the device;
forming a third ohmic contact on the substrate opposite the drift layer; and
depositing a metal layer on each of the first, second and third ohmic contacts.

A semiconductor device is also provided which comprises:
an n-type semiconductor substrate;
a buffer layer of n-type semiconductor material on the substrate;
a drift layer of n-type semiconductor material on the buffer layer;
a plurality of channel regions of n-type semiconductor material on the drift layer, each of the channel regions having a lower surface adjacent the drift layer, an upper surface opposite the lower surface and sidewalls;
a source layer of n-type semiconductor material on the upper surface of the channel regions;
a first ohmic contact on the source layer;
a gate layer of p-type semiconductor material on the sidewalls of the channel regions and on the surface of the drift layer between the channel regions, the gate layer having a lower surface adjacent the channel regions and drift layer and an upper surface opposite the lower surface, the gate layer having a graded dopant concentration, wherein the dopant concentration in a lower portion of the gate layer adjacent the lower surface is less than the dopant concentration in an upper portion of the gate layer adjacent the upper surface;

a second ohmic contact on the gate layer between the channel regions in a central portion of the device and on the gate layer adjacent the regions of n-type semiconductor material in an inner peripheral portion of the device;

a dielectric material between and adjacent the plurality of regions of p-type semiconductor material in the central portion of the device, wherein the second ohmic contact is not covered by the dielectric material in the inner peripheral portion of the device;

a third ohmic contact on the substrate opposite the buffer layer;

a metal layer on the first ohmic contact;

a metal layer on the second ohmic contact in the inner peripheral portion of the device; and a metal layer on the third ohmic contact.

A semiconductor device is also provided which comprises:

an n-type semiconductor substrate;

a buffer layer of n-type semiconductor material on the substrate;

a drift layer of n-type semiconductor material on the buffer layer;

a plurality of gate regions of p-type semiconductor material on the drift layer, each of the gate regions having a lower surface adjacent the drift layer, an upper surface opposite the lower surface and sidewalls, the gate regions having a graded dopant concentration wherein the dopant concentration in a lower portion of the gate regions adjacent the lower surface and the dopant concentration in an upper portion of the gate regions adjacent the upper surface is less than the dopant concentration in a central portion of the gate regions between the upper and lower regions;

an isolation layer of n-type semiconductor material on the upper surface of the gate regions;

a source layer of n-type semiconductor material on the isolation layer;

a first ohmic contact on the source layer;

a channel layer of n-type material on the sidewalls of the gate regions;

a gate layer of p-type semiconductor material on the channel layer and on the surface of the drift layer between and adjacent the gate regions, the gate layer having a lower surface adjacent the channel and drift layers and an upper surface opposite the lower surface, the gate layer having a graded dopant concentration wherein the dopant concentration in a lower portion of the gate layer adjacent the lower surface is less than the dopant concentration in an upper portion of the gate layer adjacent the upper surface;

a second ohmic contact on the gate layer between the gate regions and adjacent the gate regions in an inner peripheral portion of the device;

a dielectric material between the gate regions and adjacent the gate regions, wherein the dielectric material covers the second ohmic contact in a central portion of the device and wherein the second ohmic contact is not covered by the dielectric material in the inner peripheral portion of the device;

a third ohmic contact on the substrate opposite the buffer layer;

a metal layer on the first ohmic contact;

a metal layer on the second ohmic contact in the inner peripheral portion of the device; and a metal layer on the third ohmic contact.

A semiconductor device is also provided which comprises:

an n-type semiconductor substrate;

a layer of n-type semiconductor material on the substrate;

a layer of p-type semiconductor material having a graded dopant concentration on the layer of n-type semiconductor material on the substrate, the layer of p-type semiconductor material having a lower surface adjacent the layer of n-type semiconductor material and an upper surface opposite the lower surface, wherein the dopant concentration in a lower portion of the layer of p-type semiconductor material adjacent the lower surface is less than the dopant concentration in an upper portion of the layer of p-type semiconductor material adjacent the upper surface;

a first ohmic contact on the upper surface of the layer of p-type semiconductor material;

a second ohmic contact on the substrate opposite the layer of n-type semiconductor material; and a metal layer on each of the first and second ohmic contacts.

A method of making a semiconductor device is also provided which comprises:

epitaxially growing a layer of p-type semiconductor material on a layer of n-type semiconductor material, wherein the layer of p-type semiconductor material has a lower surface adjacent the layer of n-type semiconductor material and an upper surface opposite the lower surface, wherein the dopant concentration in the layer of p-type semiconductor material is increased during epitaxial growth such that the dopant concentration in a lower portion of the layer of p-type semiconductor material adjacent the lower surface is less than the dopant concentration in an upper portion of the layer of p-type semiconductor material adjacent the upper surface, and wherein the layer of n-type semiconductor material is on an n-type semiconductor substrate;

forming a first ohmic contact on the upper surface of the p-type layer;

forming a second ohmic contact on the substrate opposite the layer of n-type semiconductor material; and forming a metal layer on each of the first and second ohmic contacts.

A semiconductor device is also provided which comprises:

an n-type semiconductor substrate;

a layer of n-type semiconductor material on the substrate;

a plurality of regions of p-type semiconductor material on the layer of n-type semiconductor material, the regions of p-type semiconductor material having a lower surface adjacent the layer of n-type semiconductor material, an upper surface opposite the lower surface and sidewalls, the regions of p-type semiconductor material having a graded dopant concentration wherein the dopant concentration in a lower portion of the regions of p-type semiconductor material adjacent the upper surface is less than the dopant concentration in an upper portion of the regions of p-type semiconductor material adjacent the upper surface;

regions of n-type semiconductor material on the layer of n-type semiconductor material between the plurality of regions of p-type semiconductor material, the regions of n-type semiconductor material having a lower surface adjacent the layer of n-type semiconductor material and an upper surface opposite the lower surface;

a Schottky metal layer on the upper surface of the regions of p-type semiconductor material and on the upper surface of the regions of n-type semiconductor material;

an ohmic contact on the substrate opposite the layer of n-type semiconductor material; and a metal layer on the ohmic contact.

A method of making a semiconductor device is also provided which comprises:

epitaxially growing a layer of p-type semiconductor material on a layer of n-type semiconductor material, wherein the layer of p-type semiconductor material has a lower surface adjacent the layer of n-type semiconductor material and an upper surface opposite the lower surface, wherein the dopant concentration in the layer of p-type semiconductor material is increased during epitaxial growth such that the dopant concentration in a lower portion of the layer of p-type semiconductor material adjacent the lower surface is less than the dopant concentration in an upper portion of the layer of p-type semiconductor material adjacent the upper surface, and wherein the layer of n-type semiconductor material is on an n-type semiconductor substrate;

selectively etching through the layer of p-type semiconductor material to form a plurality of regions of p-type semiconductor material each having an upper surface and sidewalls;

depositing n-type semiconductor material between the regions of p-type semiconductor material;

etching the n-type semiconductor material to expose the upper surfaces of the p-type regions of semiconductor material;

forming a Schottky metal layer on exposed surfaces of the p-type regions and on the n-type semiconductor material therebetween;

forming an ohmic contact on the substrate opposite the layer of n-type semiconductor material; and forming a metal layer on the ohmic contact.

These and other features of the present teachings are set forth herein.

BRIEF DESCRIPTION OF THE DRAWINGS

The skilled artisan will understand that the drawings, described below, are for illustration purposes only. The drawings are not intended to limit the scope of the present teachings in any way.

DESCRIPTION OF THE VARIOUS EMBODIMENTS

For the purposes of interpreting this specification, the use of "or" herein means "and/or" unless stated otherwise or where the use of "and/or" is clearly inappropriate. The use of "a" herein means "one or more" unless stated otherwise or where the use of "one or more" is clearly inappropriate. The use of "comprise," "comprises," "comprising," "include," "includes," and "including" are interchangeable and not intended to be limiting. Furthermore, where the description of one or more embodiments uses the term "comprising," those skilled in the art would understand that, in some specific instances, the embodiment or embodiments can be alternatively described using the language "consisting essentially of" and/or "consisting of" It should also be understood that in some embodiments the order of steps or order for performing certain actions is immaterial so long as the present teachings remain operable. Moreover, in some embodiments two or more steps or actions can be conducted simultaneously.

Methods of making semiconductor devices such as junction field-effect transistors (JFETs) or junction barrier Schottky (JBS) diodes are described herein. The methods do not require ion implantation. Devices made by these methods are also described.

The devices can be made from a wide-bandgap semiconductor material such as silicon carbide (SiC). The devices can therefore be used in high temperature applications.

A method of making SiC JFETs and JBS diodes having graded p-type semiconductor layers is also provided. The graded p-type semiconductor layers can improve device performance and long-term reliability.

The graded p-type semiconductor layers can be formed by varying the dopant concentration during epitaxial growth. The graded p-type region can reduce or eliminate electric field crowding in the vicinity of p-n junctions formed by epitaxial growth of highly doped p-type layers and therefore enhance the p-n junction robustness without degrading the efficiency of conductivity modulation.

Compared to methods employing ion implantation to form the p-n junction, the methods described herein have various advantages. First, the methods described herein allow for the fabrication of p-n junctions that can be easily depleted and that have improved minority carrier lifetimes and hence improved conductivity modulation. The methods described herein also avoid problems due to unexpected variation of the structure (e.g., doping and geometry) of p-n junctions resulting from ion implantation. The methods described herein also allow for the reliable grading of the electrical field in the vicinity of the p-n junction. Furthermore, the use of an epitaxially grown p-type region can eliminate the concern for incomplete activation of the implanted p-type dopants as well as concerns about the creation of unintended implantation-induced defects, resulting in a significantly higher yield and reduced device manufacturing costs.

The methods described herein also allow for precisely and readily controlled p-n junction dimensions, including greater depth of the p-type region than is physically possible with implantation. For example, even using high KeV implantation, implanted p-type regions typically have depths which are on the order of 0.5 µm. In contrast, using epitaxial growth the p-type regions can have depths exceeding 1 µm. As a result, considerably better optimization of the design trade between the reverse blocking performance and the forward conduction performance (i.e., on-resistance) of the devices can be achieved.

The methods described herein also allow for an optional p-type external "bus bar" to be added when creating the $p^+/p$ fingers. The p-type external bus bar can connect all of the p-type fingers which can be either buried into the overgrown $N^-$ drift region or exposed to a metal contact in order to reduce the gate resistance and hence improve the switching performance of the devices.

The methods described herein also allow for the use of a heavily doped p-type material for efficient conductivity modulation that can be obtained without a high temperature post anneal. For SiC Schottky diodes, this can eliminate surface degradation of the SiC Schottky contact area which can be caused by the high temperature (e.g., >1500° C.) anneal thus improving the ideality and performance of the Schottky diode while simultaneously improving the conductivity modulation of the $p^+$/p-n diode.

The graded p-type region can have either continuous or discrete doping profile. The number of discrete doping levels for a discrete graded p-type region can be varied from two levels for easier fabrication to a larger number in order to approximate a continuous doping profile.

Figure 1:
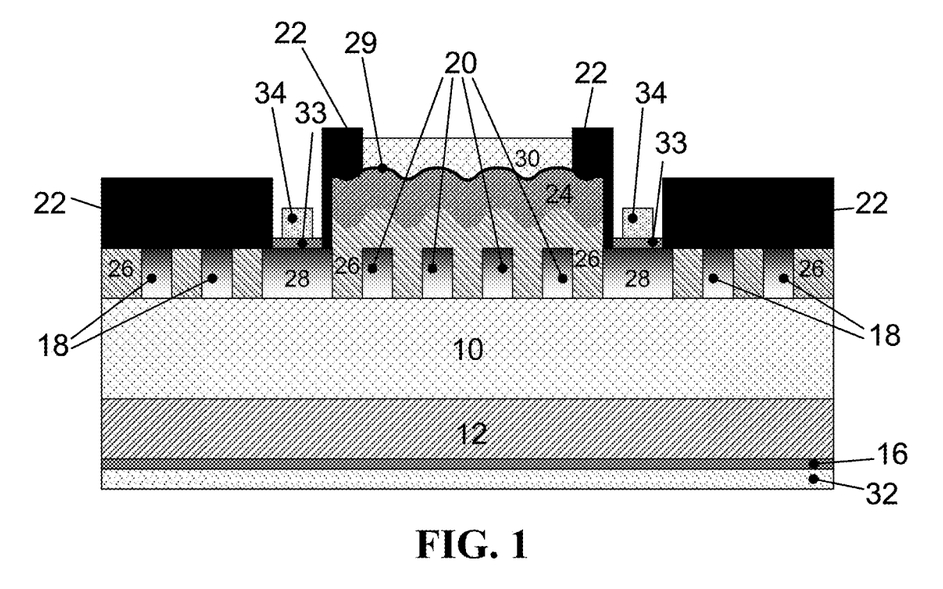
FIG. 1 is a schematic of a junction field effect transistor (JFET) having a laterally graded and buried p-n junction gate with graded p-type guard rings.
Figure 2:
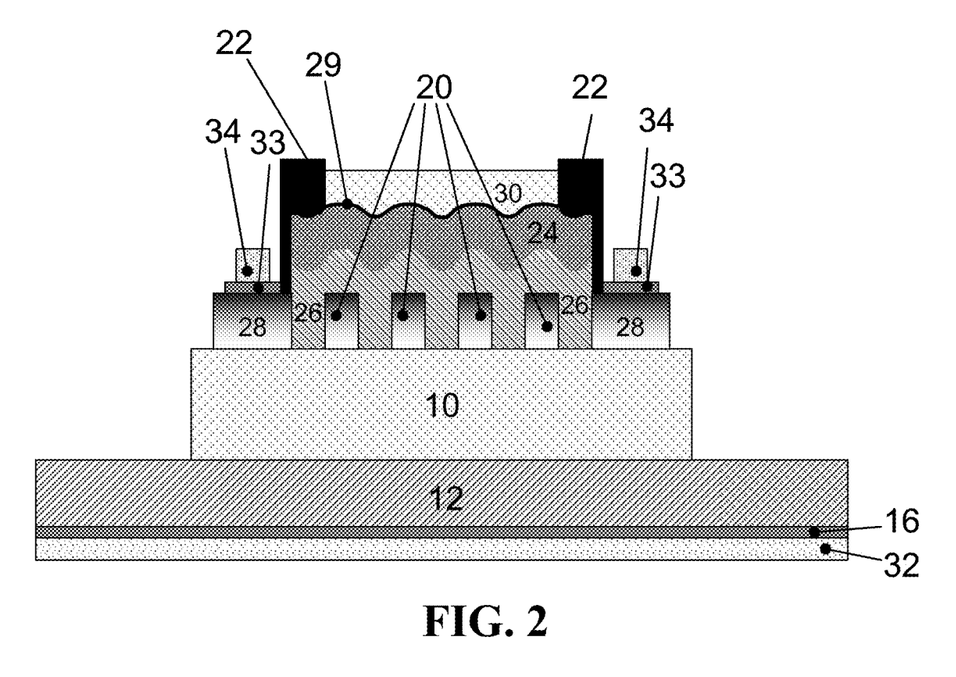
FIG. 2 is a schematic of a junction field effect transistor having a laterally graded and buried p-n junction gate with a mesa edge termination.

The graded p-type region can be laterally graded by growing the p-type region prior to the n-type channel region overgrowth as shown in FIGS. 1 and 2. FIG. 1 is a schematic of a junction field effect transistor (JFET) having a laterally graded and buried p-n junction gate with graded p-type guard rings. FIG. 2 is a schematic of a junction field effect transistor having a laterally graded and buried p-n junction gate with a mesa edge termination.

As shown in FIGS. 1 and 2, the semiconductor device comprises: an n-type semiconductor substrate 12; a drift layer of n-type semiconductor material 10 on the substrate 12 and a plurality of gate regions of p-type semiconductor material 20, 28 on the drift layer 10. The gate regions 20, 28 have a lower surface adjacent the drift layer 10, an upper surface opposite the lower surface and sidewalls. The gate regions 20, 28 have a graded dopant concentration wherein the dopant concentration in a lower portion of the gate regions 20, 28 adjacent the lower surface is less than the dopant concentration in an upper portion of the gate regions 20, 28 adjacent the upper surface. The device also comprises a channel layer of n-type semiconductor material 26 on and between the plurality of gate regions in a central portion of the device 20, wherein the channel layer covers the gate regions of p-type semiconductor material in the central portion of the device 20. As also shown in FIGS. 1 and 2, one or more gate regions 28 are exposed in an inner peripheral portion of the device. The device also comprises a source layer of n-type semiconductor material 24 on the channel layer 26, a first ohmic contact 29 on the source layer, a second ohmic contact 33 on the one or more exposed gate regions in the peripheral portion of the device 28, a third ohmic contact 16 on the substrate 12 opposite the drift layer 10, a metal layer 30 on the first ohmic contact 29, a metal layer 34 on the second ohmic contact 33 and a metal layer 32 on the third ohmic contact 16. As shown in FIGS. 1 and 2, the device also comprises a dielectric material 22.

The dopant concentration in the upper portion of the gate regions can be at least $1\times10^{19}/cm^3$ and the dopant concentration in the lower portion of the gate regions can be less than $1\times10^{17}/cm^3$. As set forth above, the dopant concentration in the gate regions can vary in a stepped manner or in a continuous manner. The semiconductor material of the substrate, the drift layer, the gate regions, the channel layer and the source layer can comprise SiC.

The gate regions of the semiconductor device shown in FIGS. 1 and 2 can have a thickness of at least 0.5 µm. The channel layer of the semiconductor device can have a dopant concentration of $1\times10^{15}/cm^3$ to $1\times10^{18}/cm^3$. The drift layer of the device can have a dopant concentration of $1\times10^{14}/cm^3$ to $5\times10^{16}/cm^3$. The source layer of the device can have a dopant concentration of at least $1\times10^{19}/cm^3$.

As shown in FIG. 1, the JFET device can have p-type guard rings. In particular, as shown in FIG. 1, the device can comprise a plurality of rings of p-type semiconductor material 18 on the drift layer 10 in an outer peripheral portion of the device, wherein each of the rings circumscribes the central and inner peripheral portions of the device. The rings 18 have a lower surface adjacent the drift layer 10 and an upper surface opposite the lower surface. The dopant concentration in a lower portion of the rings 18 adjacent the lower surface can be less than the dopant concentration in an upper portion of the rings 18 adjacent the upper surface. For example, the dopant concentration in the upper portion of the rings 18 can be at least $1\times10^{19}/cm^3$ and the dopant concentration in the lower portion of the rings 18 can be less than $1\times10^{17}/cm^3$.

As shown in FIG. 2, the JFET can have a mesa termination wherein the substrate 12 is not covered by the drift layer 10 in an outer peripheral portion of the device.

Although FIGS. 1 and 2 show a JFET device with guard rings and a mesa termination, respectively, the JFET device can also be terminated with a junction termination extension (JTE) (not shown).

The device of FIGS. 1 and 2 can be made by epitaxially growing a gate layer of p-type semiconductor material on a drift layer of n-type semiconductor material wherein the drift layer is on an n-type semiconductor substrate. The gate layer has a lower surface adjacent the drift layer and an upper surface opposite the lower surface. The dopant concentration in the gate layer can be increased during epitaxial growth such that the dopant concentration in a lower portion of the gate layer adjacent the lower surface is less than the dopant concentration in an upper portion of the gate layer adjacent the upper surface. The gate layer can be selectively etched through (e.g., using an etch mask) to form a plurality of gate regions of p-type semiconductor material each having an upper surface and sidewalls. An n-type semiconductor material can then be epitaxially grown between and on the gate regions such that the channel layer covers the gate regions. The channel layer can be selectively etched in an inner peripheral portion of the device to expose one or more gate regions of p-type semiconductor material. A source layer of n-type semiconductor material can then be deposited on the channel layer. A first ohmic contact can be formed on the source layer. A second ohmic contact can be formed on the one or more gate regions in the peripheral portion of the device, a third ohmic contact can be formed on the substrate opposite the drift layer and a metal layer can be deposited on each of the first, second and third ohmic contacts.

Etching through the gate layer to form a plurality of regions of p-type semiconductor material can further comprise etching through the layer of p-type semiconductor material in an outer peripheral portion of the device to form a plurality of rings of p-type semiconductor material circumscribing the central and inner peripheral portions of the device. A device having p-type guard rings is shown in FIG. 1.

The method can further comprise etching through the drift layer to expose the substrate in an outer peripheral portion of the device to form a mesa termination. A device having a mesa termination is shown in FIG. 2.

Figure 3:
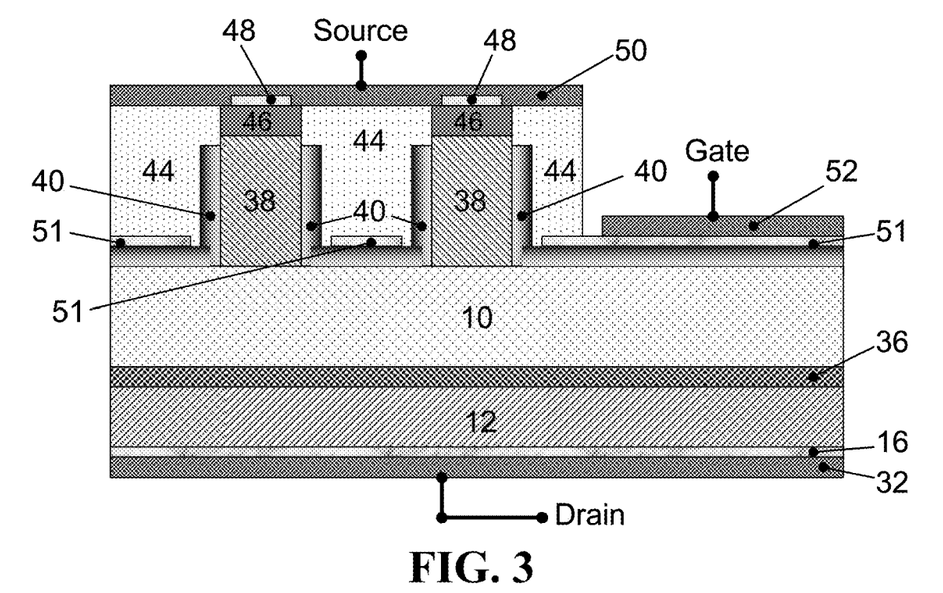
FIG. 3 is a schematic of a junction field effect transistor having a vertically graded p-n junction gate.
Figure 4:
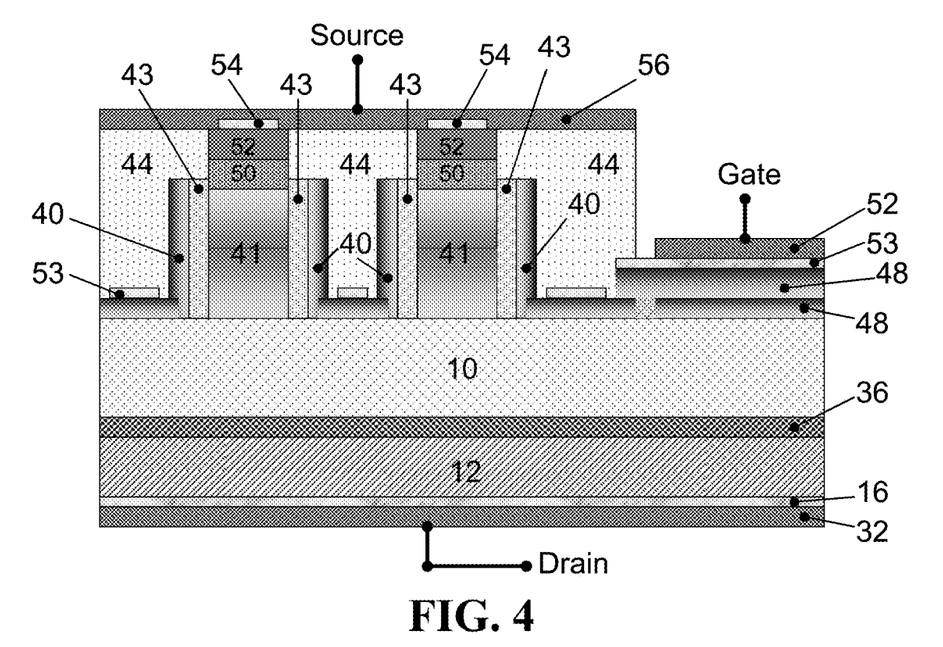
FIG. 4 is a schematic of a junction field effect transistor having a vertically and laterally graded p-n junction gate.

The graded p-type region can be vertically graded by growing or re-growing an n-type channel region prior to regrowth of the graded p-type region on the channel sidewall and trench bottom as shown in FIGS. 3 and 4. This technique may be used to mimic a $p^{30}$ implantation profile.

FIG. 3 is a schematic of a junction field effect transistor having a vertically graded p-n junction gate. As shown in FIG. 3, the device comprises: an n-type semiconductor substrate 12; a buffer layer of n-type semiconductor material 36 on the substrate 12; a drift layer of n-type semiconductor material 10 on the buffer layer 36; and a plurality of channel regions of n-type semiconductor material 38 on the drift layer 10. As also shown in FIG. 3, each of the channel regions 38 has a lower surface adjacent the drift layer 10, an upper surface opposite the lower surface and sidewalls. As shown in FIG. 3, the device also comprises a source layer of n-type semiconductor material 46 on the upper surface of the channel regions 38, a first ohmic contact 48 on the source layer 46, a gate layer of p-type semiconductor material 40 on the sidewalls of the channel regions 38 and on the surface of the drift layer 10 between the channel regions 38. As shown in FIG. 3, the gate layer 40 has a lower surface adjacent the channel regions 38 and drift layer 10 and an upper surface opposite the lower surface. As also shown in FIG. 3, the gate layer has a graded dopant concentration, wherein the dopant concentration in a lower portion of the gate layer adjacent the lower surface is less than the dopant concentration in an upper portion of the gate layer adjacent the upper surface. Accordingly, the gate layer on the sidewalls of the channel regions is vertically graded.

As shown in FIG. 3, the device further comprises a second ohmic contact 51 on the gate layer 50 between the channel regions 38 in a central portion of the device and on the gate layer 40 adjacent the channel regions 38 in an inner peripheral portion of the device. The device also comprises a dielectric material 44 between and adjacent the channel regions 38 in the central portion of the device. As shown in FIG. 3, at least a portion of the second ohmic contact 51 is not covered by the dielectric material 44 in the inner peripheral portion of the device. As also shown in FIG. 3, the device comprises a third ohmic contact 16 on the substrate 12 opposite the buffer layer 36, a metal layer 50 on the first ohmic contact 48, a metal layer 52 on the second ohmic contact 51 in the inner peripheral portion of the device, and a metal layer 32 on the third ohmic contact 16.

The device of FIG. 3 can be terminated with p-type guard rings (not shown). The p-type guard rings can be etched from the gate layer 40 in an outer peripheral portion of the device. The device of FIG. 3 can also be terminated with a mesa termination (not shown) or a junction termination extension (JTE) (not shown).

The channel regions 38 in the device of FIG. 3 can comprise a plurality of elongate regions connected at one end with an additional elongate region. For example, the channel regions 38 can be in the form of fingers wherein the gate layer 40 is formed between and on the sidewalls of the elongate regions or fingers.

The device shown in FIG. 3 can be made by selectively etching through a source layer of n-type semiconductor material and an underlying channel layer of n-type semiconductor material to form a plurality of n-type channel regions having upper surfaces and sidewalls, wherein the channel layer is on a drift layer of n-type semiconductor material which is on a buffer layer of n-type semiconductor material which is on an n-type semiconductor substrate. A graded gate layer of p-type semiconductor material can then be epitaxially grown on the upper surfaces and sidewalls of the channel regions and on exposed portions of the drift layer. The graded gate layer of p-type semiconductor material can then be anisotropically etched to remove gate layer material from the upper surfaces of the source layer and from the surfaces of the drift layer between and adjacent the channel regions. A first conforming layer of dielectric material can then be deposited on the channel regions and on the drift layer between and adjacent the channel regions. The conforming dielectric layer can then be anisotropically etched to remove the dielectric from the upper surface of the source layer and from the drift layer leaving a layer of dielectric on the sidewalls of the channel regions. Self aligned ohmic contacts can then be formed on the drift layer between the channel regions and on the drift layer adjacent the channel regions. Additional dielectric material can then be deposited on and between the channel regions such that the channel regions are completely covered by the dielectric material. The dielectric material can then be etched to expose the upper surfaces of the source layer on the channel regions. An ohmic contact can then formed on the source layer. The dielectric can then be selectively etched through in a peripheral portion of the device to expose the ohmic contact on the gate layer. A drain ohmic contact can be formed on the substrate opposite the buffer layer. Final metal layers can then be deposited on the ohmic contact on the source layer, the ohmic contact on the gate layer and the drain ohmic contact.

FIG. 4 is a schematic of a junction field effect transistor having a vertically and laterally graded p-n junction gate. As shown in FIG. 4, the device comprises: an n-type semiconductor substrate 12; a buffer layer of n-type semiconductor material 36 on the substrate 12; a drift layer of n-type semiconductor material 10 on the buffer layer 36; and a plurality of gate regions of p-type semiconductor material 41 on the drift layer 10. Each of the gate regions 41 has a lower surface adjacent the drift layer 10, an upper surface opposite the lower surface and sidewalls. As also shown in FIG. 4, the gate regions 41 have a graded dopant concentration wherein the dopant concentration in a lower portion of the gate regions 41 adjacent the lower surface and the dopant concentration in an upper portion of the gate regions 41 adjacent the upper surface is less than the dopant concentration in a central portion of the gate regions 41 between the upper and lower regions. Accordingly, the gate regions are laterally graded.

As also shown in FIG. 4, the device comprises an isolation layer of n-type semiconductor material 50 on the upper surface of the gate regions 41, a source layer of n-type semiconductor material 52 on the isolation layer 50, a first ohmic contact 54 on the source layer 52, a channel layer of n-type semiconductor material 43 on the sidewalls of the gate regions 41; a gate layer of p-type semiconductor material 40 on the channel layer 43 and on the surface of the drift layer 10 between and adjacent the gate regions 41. As shown in FIG. 4, the gate layer 40 has a lower surface adjacent the channel layer 43 and drift layer 10 and an upper surface opposite the lower surface. As also shown in FIG. 4, the gate layer 40 has a graded dopant concentration wherein the dopant concentration in a lower portion of the gate layer 40 adjacent the lower surface is less than the dopant concentration in an upper portion of the gate layer adjacent the upper surface. Accordingly, the gate layer on the channel layer on the sidewalls of the gate regions is vertically graded.

As also shown in FIG. 4, the device comprises a second ohmic contact 53 on the gate layer between the gate regions in a central portion of the device and adjacent the gate regions in a peripheral portion of the device. As also shown in FIG. 4, the device comprises a dielectric material 44 between the gate regions 41 and adjacent the gate regions 41, wherein the dielectric material 44 covers the second ohmic contact in a central portion of the device and wherein the second ohmic contact is not covered by the dielectric material in an inner peripheral portion of the device. The device also comprises a third ohmic contact 16 on the substrate 12 opposite the buffer layer 36, a metal layer 56 on the first ohmic contact 54, a metal layer 52 on the second ohmic contact 53 in the inner peripheral portion of the device and a metal layer 32 on the third ohmic contact 16.

The device shown in FIG. 4 can be made by epitaxially growing a graded layer of p-type semiconductor material on a drift layer of n-type semiconductor material which is on a buffer layer of n-type semiconductor material which is on an n-type semiconductor substrate. The graded layer of p-type semiconductor material has a lower surface adjacent the drift layer and an upper surface opposite the lower surface. The graded layer of p-type semiconductor material has a graded dopant concentration wherein the dopant concentration in a lower portion of the graded layer of p-type semiconductor material adjacent the lower surface and the dopant concentration in an upper portion of the graded layer of p-type semiconductor material adjacent the upper surface is less than the dopant concentration in a central portion of the graded layer of p-type semiconductor material between the upper and lower portions. An isolation layer of n-type semiconductor material is then epitaxially grown on the upper surface of the graded layer of p-type semiconductor material. A source layer of n-type semiconductor material is then epitaxially grown on the isolation layer. The source, isolation and graded layer of p-type semiconductor material are then selectively etched through to form a plurality of source regions having upper surfaces and sidewalls on the drift layer. A channel layer of n-type semiconductor material is then epitaxially grown on the upper surfaces and sidewalls of the source regions and on the drift layer between and adjacent the source regions. The channel layer is then anisotropically etched to remove channel layer material from the upper surfaces of the source regions and from the drift layer between and adjacent the source regions. A graded gate layer of p-type semiconductor material is then deposited on the channel layer on the sidewalls of the source regions, on the upper surfaces of the source regions and on the drift layer between and adjacent the source regions. The gate layer has a lower surface adjacent the channel and drift layers and an upper surface opposite the lower surface. The gate layer has a graded dopant concentration wherein the dopant concentration in a lower portion of the gate layer adjacent the lower surface is less than the dopant concentration in an upper portion of the gate layer adjacent the upper surface. The graded gate layer is then removed from the upper surfaces of the source regions while leaving the graded gate layer on the drift layer between and adjacent the source regions (e.g., using a trench fill material). A first conforming layer of dielectric material can then be deposited on the upper surfaces and sidewalls of the source regions and on the graded gate layer between and adjacent the source regions. The conforming dielectric layer can then be anisotropically etched to remove the dielectric from the upper surfaces of the source regions and from the graded gate layer between and adjacent the source regions while leaving a layer of dielectric on the sidewalls of the source regions. Self aligned ohmic contacts can then be formed on the graded gate layer between and adjacent the source regions. Additional dielectric material can then be deposited on and between the source regions such that the source regions are completely covered by the dielectric material. The dielectric material can then be etched to expose the upper surfaces of the source regions. An ohmic contact can then formed on the exposed upper surfaces of the source regions. The dielectric material can then be selectively etched through in a peripheral portion of the device to expose the ohmic contact on the gate layer. A drain ohmic contact can be formed on the substrate opposite the buffer layer. Final metal layers can then be deposited on the ohmic contact on the source layer, the ohmic contact on the gate layer and on the drain ohmic contact.

The gate regions 41 in the device shown in FIG. 4 can comprise a plurality of elongate regions connected at one end with an additional elongate region. For example, the gate regions 41 can be in the form of fingers wherein the channel layer 43 is formed on the sidewalls of the elongate regions or fingers and the gate layer 40 is formed on the channel layer 43 and on the drift layer 10 between the fingers.

Figure 5:
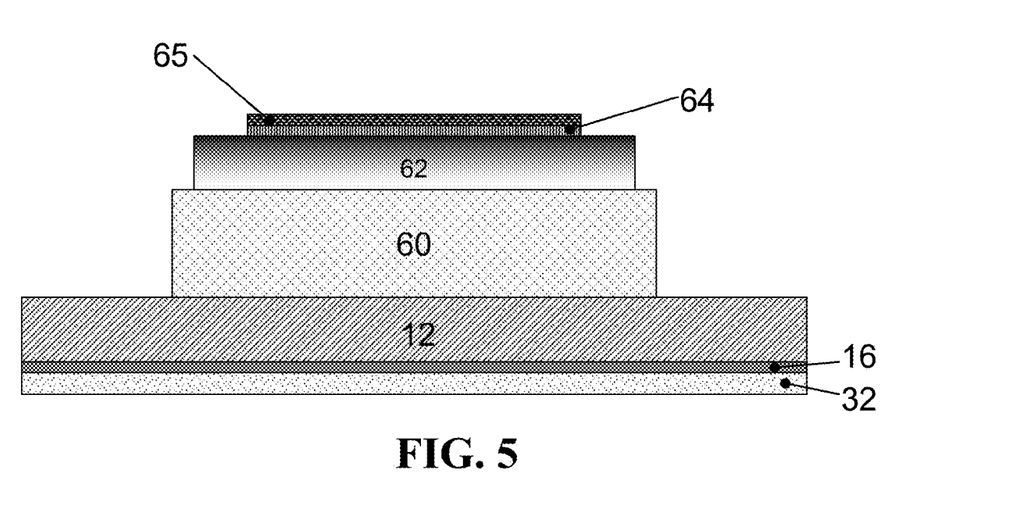
FIG. 5 is a schematic of a PiN diode having a mesa edge termination.

As set forth above, diodes such as PiN and Schottky barrier diodes are also provided. FIG. 5 is a schematic of a PiN diode having a mesa edge termination. As shown in FIG. 5, the device comprises: an n-type semiconductor substrate 12; a layer of n-type semiconductor material 60 on the substrate 12; and a layer of p-type semiconductor material 62 on the layer of n-type semiconductor material 60 on the substrate 12. The layer of p-type semiconductor material 62 has a lower surface adjacent the layer of n-type semiconductor material 60 and an upper surface opposite the lower surface. The layer of p-type semiconductor material 62 has a graded dopant concentration wherein the dopant concentration in a lower portion of the layer of p-type semiconductor material 62 adjacent the lower surface is less than the dopant concentration in an upper portion of the layer of p-type semiconductor material 62 adjacent the upper surface. As also shown in FIG. 5, a first ohmic contact 64 is on the upper surface of the layer of p-type semiconductor material 62, a metal layer 65 is on the first ohmic contact 64, a second ohmic contact 16 is on the substrate 12 opposite the layer of n-type semiconductor material 60 and a metal layer 32 is on the second ohmic contact 16.

For the PiN diode of FIG. 5, the layer of n-type semiconductor material on the substrate can have a dopant concentration of $1\times10^{14}/cm^3$ to $5\times10^{16}/cm^3$. The n-type semiconductor substrate, the layer of n-type semiconductor material on the substrate, and the layer of p-type semiconductor material can comprise SiC. The dopant concentration in the upper portion of the p-type layer can be at least $1\times10^{19}/cm^3$ and the dopant concentration in the lower portion of the p-type layer can be less than $1\times10^{17}/cm^3$.

The device of FIG. 5 can be made by a method comprising epitaxially growing a layer of p-type semiconductor material on a layer of n-type semiconductor material wherein the layer of p-type semiconductor material has a lower surface adjacent the layer of n-type semiconductor material and an upper surface opposite the lower surface. The dopant concentration in the layer of p-type semiconductor material is increased during epitaxial growth such that the dopant concentration in a lower portion of the layer of p-type semiconductor material adjacent the lower surface is less than the dopant concentration in an upper portion of the layer of p-type semiconductor material adjacent the upper surface. An ohmic contact can then be formed on the upper surface of the p-type layer. An ohmic contact can be formed on the substrate opposite the layer of n-type semiconductor material. Metal layers can then be formed on the ohmic contacts.

Although the device of FIG. 5 is shown having a mesa termination, other termination structures including, but not limited to, guard rings and junction termination extensions (JTEs) can also be used. When guard rings are used, the guard rings can be etched from the layer of p-type semiconductor material having a graded dopant concentration such that the guard rings also have a graded dopant concentration.

Figure 6:
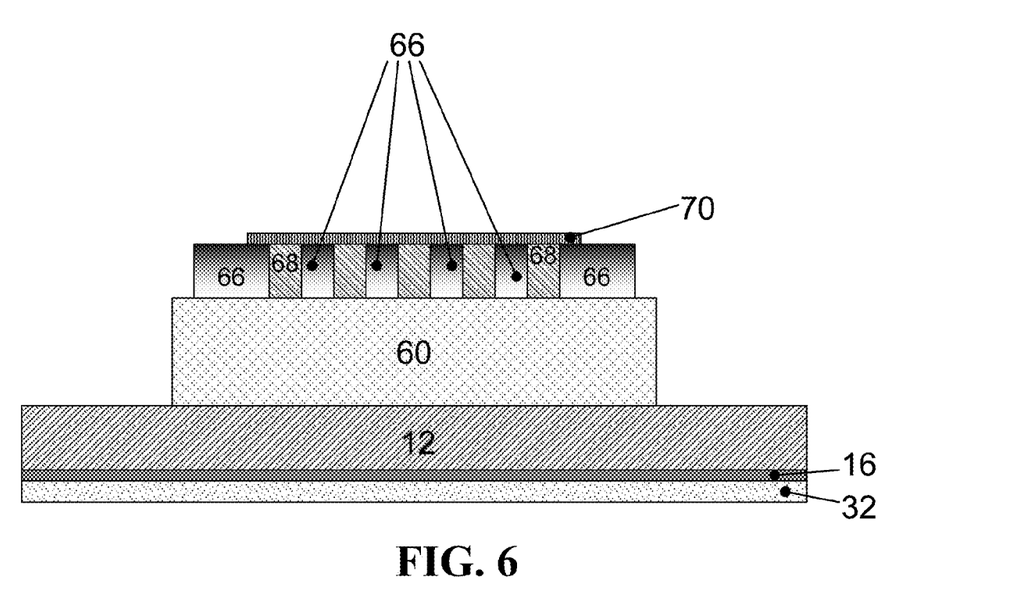
FIG. 6 is a schematic of a junction barrier Schottky (JBS) diode having a mesa edge termination.

FIG. 6 is a schematic of a junction barrier Schottky (JBS) diode with a mesa edge termination. As shown in FIG. 6, the device comprises: an n-type semiconductor substrate 12; a layer of n-type semiconductor material 60 on the substrate 12; and a plurality of regions of p-type semiconductor material 66 on the layer of n-type semiconductor material 60. The regions of p-type semiconductor material 66 have a lower surface adjacent the layer of n-type semiconductor material 60, an upper surface opposite the lower surface and sidewalls. The regions of p-type semiconductor material also have a graded dopant concentration wherein the dopant concentration in a lower portion of the regions of p-type semiconductor material 66 adjacent the upper surface is less than the dopant concentration in an upper portion of the regions of p-type semiconductor material 66 adjacent the upper surface. As also shown in FIG. 6, the device comprises regions of n-type semiconductor material 68 on the layer of n-type semiconductor material 60 between the plurality of regions of p-type semiconductor material 66. The regions of n-type semiconductor material 68 have a lower surface adjacent the layer of n-type semiconductor material 60 and an upper surface opposite the lower surface. As also shown in FIG. 6, a Schottky metal layer 70 is on the upper surface of the regions of p-type semiconductor material 66 and on the upper surface of the regions of n-type semiconductor material 68. As also shown in FIG. 6, an ohmic contact 16 is on the substrate 12 opposite the layer of n-type semiconductor material 60 and a metal layer 32 is on the ohmic contact 16.

In the device shown in FIG. 6, the layer of n-type semiconductor material 60 on the substrate 12 can have a dopant concentration of $1\times10^{14}/cm^3$ to $5\times10^{16}/cm^3$. The n-type semiconductor substrate, the layer of n-type semiconductor material on the substrate, and the plurality of regions of p-type semiconductor material can comprise SiC. The dopant concentration in the upper portion of the p-type layer can be at least $1\times10^{19}/cm^3$ and the dopant concentration in the lower portion of the p-type layer can be less than $1\times10^{17}/cm^3$.

The regions of p-type semiconductor material 66 in the device of FIG. 6 can comprise a plurality of elongate regions connected at one end with an additional elongate region. The regions of n-type semiconductor material 68 can also comprise a plurality of elongate regions connected at one end with an additional elongate region. For example, the regions of p-type semiconductor material 66 and the regions of n-type semiconductor material 68 can be in the form of interdigitated fingers. The dimensions of the fingers can be varied to produce a semiconductor device having desired characteristics for a given end-use application.

The device shown in FIG. 6 can be made by a method comprising epitaxially growing a layer of p-type semiconductor material on a layer of n-type semiconductor material wherein the layer of n-type semiconductor material is on an n-type semiconductor substrate and wherein the dopant concentration in the layer of p-type semiconductor material is increased during epitaxial growth. The layer of p-type semiconductor material thus formed has a lower surface adjacent the layer of n-type semiconductor material and an upper surface opposite the lower surface and the dopant concentration in a lower portion of the layer of p-type semiconductor material adjacent the lower surface is less than the dopant concentration in an upper portion of the layer of p-type semiconductor material adjacent the upper surface. The layer of p-type semiconductor material can then be selectively etched through (e.g., using an etch mask) to form a plurality of regions of p-type semiconductor material each having an upper surface and sidewalls. An n-type semiconductor material can then be epitaxially grown between and on the regions of p-type semiconductor material. The n-type semiconductor material can then be etched to expose the upper surfaces of the p-type regions of semiconductor material. A Schottky metal layer can then be formed on exposed surfaces of the p-type regions and on exposed surfaces of the n-type semiconductor material therebetween. An ohmic contact can be formed on the substrate opposite the layer of n-type semiconductor material and a metal layer the can be formed on the ohmic contact.

Although the device of FIG. 6 is shown having a mesa termination, other termination structures including, but not limited to, guard rings and junction termination extensions can also be used. When guard rings are used, the guard rings can be etched from the layer of p-type semiconductor material having a graded dopant concentration. The guard rings can be etched during the selective etching of the layer of p-type semiconductor material to form a plurality of regions of p-type semiconductor material.

In the methods described herein, the dopant concentration can be increased in a stepped manner during epitaxial growth. The dopant concentration can also be increased continuously during epitaxial growth. The dopant concentration can also be increased both continuously and in a stepped manner during epitaxial growth.

The devices described above can be used as high-temperature and high power switches in devices including, but not limited to, power factor correction (PFC) modules, DC/DC or DC/AC invertors, motor drivers and power supplies.

The devices can be used in high-temperature, high-power (e.g., at least 600 V) applications. The devices can be SiC JFETs and diodes such as Schottky Barrier Diodes (SBDs), Junction Barrier Schottky Diodes (JBS), merged PiN Schottky Diodes (MPS) and PiNs for high-power applications.

The devices can be used in RF power applications.

The semiconductor material used to manufacture the devices can be a wide-bandgap semiconductor material (i.e., a semiconductor material with $E_G>2$ eV). Exemplary non-limiting examples of wide-bandgap semiconductor materials include silicon carbide (SiC) and Group III nitride compounds (e.g., gallium nitride GaN).

The layers of the device can be formed by doping the layers with donor or acceptor materials using known techniques. Exemplary donor materials for SiC include nitrogen and phosphorus. Nitrogen is a preferred donor material for SiC. Exemplary acceptor materials for doping SiC include boron and aluminum. Aluminum is a preferred acceptor material for SiC. The above materials are merely exemplary, however, and any acceptor and donor materials which can be doped into silicon carbide can be used.

The graded dopant concentrations can be achieved using epitaxial growth (e.g., by varying the flow of precursor gases during growth). For example, the graded dopant concentrations can be achieved by using epitaxial reactors that allow specifying gas flow as an analytical function of time.

The layers or regions having graded dopant concentrations can have dopant concentrations ranging from less than $1\times10^{17}/cm^3$ to greater than $1\times10^{19}/cm^3$. For example, the layers or regions having graded dopant concentrations can have dopant concentrations ranging from about $1\times10^{16}/cm^3$ (e.g., $5\times10^{15}/cm^3$ to $5\times10^{16}/cm^3$ or $7.5\times10^{15}/cm^3$ to $2.5\times10^{16}/cm^3$ or $9.5\times10^{15}/cm^3$ to $1.5\times10^{16}/cm^3$) to greater than $1\times10^{19}/cm^3$.

The dopant concentrations and thicknesses of the various layers of the device described herein can be varied to produce a device having desired characteristics for a particular application. Similarly, the dimensions of the various features of the device can also be varied to produce a device having desired characteristics for a particular application.

The layers of semiconductor material can be formed by epitaxial growth on a suitable substrate. The layers can be doped during epitaxial growth.

While the foregoing specification teaches the principles of the present invention, with examples provided for the purpose of illustration, it will be appreciated by one skilled in the art from reading this disclosure that various changes in form and detail can be made without departing from the true scope of the invention.

What is claimed is:

1. A semiconductor device comprising:
an n-type semiconductor substrate;
a drift layer of n-type semiconductor material on the substrate;
a plurality of gate regions of p-type semiconductor material each having a graded dopant concentration on the drift layer, the gate regions having a lower surface adjacent the drift layer, an upper surface opposite the lower surface and sidewalls, wherein the dopant concentration in a lower portion of the gate regions adjacent the lower surface is less than the dopant concentration in an upper portion of the gate regions adjacent the upper surface;

a channel layer of n-type semiconductor material on and between the plurality of gate regions in a central portion of the device, wherein the channel layer of n-type semiconductor material covers the plurality of regions of p-type semiconductor material in the central portion of the device, and wherein one or more gate regions are not covered by the channel layer in an inner peripheral portion of the device;

a source layer of n-type semiconductor material on the channel layer;

a first ohmic contact on the source layer;

a second ohmic contact on one or more of the exposed gate regions in the peripheral portion of the device;

a third ohmic contact on the substrate opposite the drift layer; and a metal layer on each of the first, second and third ohmic contacts.

2. The semiconductor device of claim 1, wherein the dopant concentration in the upper portion of the gate regions is at least $1 \times 10^{19}/cm^3$ and wherein the dopant concentration in the lower portion of the gate regions is less than $1 \times 10^{17}/cm^3$.

3. The semiconductor device of claim 1, wherein the dopant concentration in the gate regions varies in a stepped manner.

4. The semiconductor device of claim 1, wherein the dopant concentration in the gate regions varies in a continuous manner.

5. The semiconductor device of claim 1, wherein the semiconductor material of the substrate, the drift layer, the gate regions, the channel layer and the source layer comprises SiC.

6. The semiconductor device of claim 1, wherein the gate regions have a thickness of at least 0.5 μm.

7. The semiconductor device of claim 1, wherein the channel layer has a dopant concentration of $1 \times 10^{15}/cm^3$ to $1 \times 10^{18}/cm^3$.

8. The semiconductor device of claim 1, wherein the drift layer has a dopant concentration of $1 \times 10^{14}/cm^3$ to $5 \times 10^{16}/cm^3$.

9. The semiconductor device of claim 1, wherein the source layer has a dopant concentration of at least $1 \times 10^{19}/cm^3$.

10. The semiconductor device of claim 1, further comprising a plurality of rings of p-type semiconductor material on the drift layer in an outer peripheral portion of the device, wherein each of the rings circumscribes the central and inner peripheral portions of the device, wherein the rings have a lower surface adjacent the drift layer and an upper surface opposite the lower surface, and wherein the dopant concentration in a lower portion of the rings adjacent the lower surface is less than the dopant concentration in an upper portion of the rings adjacent the upper surface.

11. The semiconductor device of claim 10, wherein the dopant concentration in the upper portion of the rings is at least $1 \times 10^{19}/cm^3$ and wherein the dopant concentration in the lower portion of the rings is less than $1 \times 10^{17}/cm^3$.

12. The semiconductor device of claim 1, wherein the substrate is not covered by the drift layer in an outer peripheral portion of the device.

13. A method of making a semiconductor device comprising:

epitaxially growing a gate layer of p-type semiconductor material on a drift layer of n-type semiconductor material, wherein the gate layer has a lower surface adjacent the drift layer and an upper surface opposite the lower surface, wherein the dopant concentration in the gate layer is increased during epitaxial growth such that the dopant concentration in a lower portion of the gate layer adjacent the lower surface is less than the dopant concentration in an upper portion of the gate layer adjacent the upper surface, and wherein the drift layer is on an n-type semiconductor substrate;

etching through the gate layer to form a plurality of gate regions of p-type semiconductor material each having an upper surface and sidewalls;

depositing a channel layer of n-type semiconductor material between the gate regions in a central portion of the device, wherein the channel layer covers the plurality of regions of p-type semiconductor material in the central portion of the device, and wherein one or more gate regions of p-type semiconductor material are not covered by the channel layer in an inner peripheral portion of the device;

depositing a source layer of n-type semiconductor material on the channel layer;

forming a first ohmic contact on the source layer;

forming a second ohmic contact on one or more gate regions in the inner peripheral portion of the device;

forming a third ohmic contact on the substrate opposite the drift layer; and depositing a metal layer on each of the first, second and third ohmic contacts.

14. The method of claim 13, wherein etching through the gate layer to form a plurality of gate regions further comprises etching through the layer of p-type semiconductor material in an outer peripheral portion of the device to form a plurality of rings of p-type semiconductor material circumscribing the central and inner peripheral portions of the device.

15. The method of claim 13, further comprising etching through the drift layer to expose the substrate in an outer peripheral portion of the device.

16. A semiconductor device comprising:

an n-type semiconductor substrate;

a buffer layer of n-type semiconductor material on the substrate;

a drift layer of n-type semiconductor material on the buffer layer;

a plurality of channel regions of n-type semiconductor material on the drift layer, each of the channel regions having a lower surface adjacent the drift layer, an upper surface opposite the lower surface and sidewalls;

a source layer of n-type semiconductor material on the upper surface of the channel regions;

a first ohmic contact on the source layer;

a gate layer of p-type semiconductor material on the sidewalls of the channel regions and on the surface of the drift layer between the channel regions, the gate layer having a lower surface adjacent the channel regions and drift layer and an upper surface opposite the lower surface, the gate layer having a graded dopant concentration, wherein the dopant concentration in a lower portion of the gate layer adjacent the lower surface is less than the dopant concentration in an upper portion of the gate layer adjacent the upper surface;

a second ohmic contact on the gate layer between the channel regions in a central portion of the device and on the gate layer adjacent the regions of n-type semiconductor material in an inner peripheral portion of the device;

a dielectric material between and adjacent the plurality of regions of p-type semiconductor material in the central portion of the device, wherein the second ohmic contact is not covered by the dielectric material in the inner peripheral portion of the device;

a third ohmic contact on the substrate opposite the buffer layer;
a metal layer on the first ohmic contact;
a metal layer on the second ohmic contact in the inner peripheral portion of the device; and
a metal layer on the third ohmic contact.

17. The semiconductor device of claim 16, wherein the buffer layer has a dopant concentration of at least $1\times10^{18}$/cm$^3$.

18. The semiconductor device of claim 16, wherein the drift layer has a dopant concentration of $1\times10^{14}$/cm$^3$ to $5\times10^{16}$/cm$^3$ and a thickness of at least 1 μm.

19. The semiconductor device of claim 16, wherein each of the channel regions has a dopant concentration of $1\times10^{15}$/cm$^3$ to $1\times10^{18}$/cm$^3$.

20. The semiconductor device of claim 16, wherein the source layer has a dopant concentration of at least $1\times10^{19}$/cm$^3$.

21. The semiconductor device of claim 16, wherein the gate layer has a thickness of at least 0.5 μm, and wherein the dopant concentration in the upper portion of the gate layer is at least $1\times10^{19}$/cm$^3$ and wherein the dopant concentration in the lower portion of the gate layer is less than $1\times10^{17}$/cm$^3$.

22. The semiconductor device of claim 16, wherein the substrate, the buffer layer, the drift layer, the channel regions, the source layer and the gate layer each comprise SiC.

23. The semiconductor device of claim 16, further comprising a plurality of rings of p-type semiconductor material on the drift layer in an outer peripheral portion of the device, wherein each of the rings circumscribes the central and inner peripheral portions of the device, wherein the rings have a lower surface adjacent the drift layer and an upper surface opposite the lower surface, and wherein the dopant concentration in a lower portion of the rings adjacent the lower surface is less than the dopant concentration in an upper portion of the rings adjacent the upper surface.

24. The semiconductor device of claim 23, wherein the dopant concentration in the upper portion of the rings is at least $1\times10^{19}$/cm$^3$ and wherein the dopant concentration in the lower portion of the rings is less than $1\times10^{17}$/cm$^3$.

25. The semiconductor device of claim 16, wherein the substrate is not covered by the buffer layer in an outer peripheral portion of the device.

26. A semiconductor device comprising:
an n-type semiconductor substrate;
a buffer layer of n-type semiconductor material on the substrate;
a drift layer of n-type semiconductor material on the buffer layer;
a plurality of gate regions of p-type semiconductor material on the drift layer, each of the gate regions having a lower surface adjacent the drift layer, an upper surface opposite the lower surface and sidewalls, the gate regions having a graded dopant concentration wherein the dopant concentration in a lower portion of the gate regions adjacent the lower surface and the dopant concentration in an upper portion of the gate regions adjacent the upper surface is less than the dopant concentration in a central portion of the gate regions between the upper and lower regions;
an isolation layer of n-type semiconductor material on the upper surface of the gate regions;
a source layer of n-type semiconductor material on the isolation layer;
a first ohmic contact on the source layer;
a channel layer of n-type material on the sidewalls of the gate regions;
a gate layer of p-type semiconductor material on the channel layer and on the surface of the drift layer between and adjacent the gate regions, the gate layer having a lower surface adjacent the channel and drift layers and an upper surface opposite the lower surface, the gate layer having a graded dopant concentration wherein the dopant concentration in a lower portion of the gate layer adjacent the lower surface is less than the dopant concentration in an upper portion of the gate layer adjacent the upper surface;
a second ohmic contact on the gate layer between the gate regions and adjacent the gate regions in an inner peripheral portion of the device;
a dielectric material between the gate regions and adjacent the gate regions, wherein the dielectric material covers the second ohmic contact in a central portion of the device and wherein the second ohmic contact is not covered by the dielectric material in the inner peripheral portion of the device;
a third ohmic contact on the substrate opposite the buffer layer;
a metal layer on the first ohmic contact;
a metal layer on the second ohmic contact in the inner peripheral portion of the device; and
a metal layer on the third ohmic contact.

27. The semiconductor device of claim 26, wherein the buffer layer has a dopant concentration of at least $1\times10^{18}$/cm$^3$.

28. The semiconductor device of claim 26, wherein the drift layer has a dopant concentration of $1\times10^{14}$/cm$^3$ to $5\times10^{16}$/cm$^3$ and a thickness of at least 1 μm.

29. The semiconductor device of claim 26, wherein the channel layer has a dopant concentration of $1\times10^{15}$/cm$^3$ to $1\times10^{18}$/cm$^3$.

30. The semiconductor device of claim 26, wherein the source layer has a dopant concentration of at least $1\times10^{19}$/cm$^3$.

31. The semiconductor device of claim 26, wherein the gate regions have a thickness of at least 0.5 μm, wherein the dopant concentration in the central portion of the gate regions is at least $1\times10^{19}$/cm$^3$ and wherein the dopant concentration in the upper and lower portions of the gate regions is less than $1\times10^{17}$/cm$^3$.

32. The semiconductor device of claim 26, wherein the gate layer has a thickness of at least 0.5 μm and wherein the dopant concentration in the upper portion of the gate layer is at least $1\times10^{19}$/cm$^3$ and wherein the dopant concentration in the lower portion of the gate layer is less than $1\times10^{17}$/cm$^3$.

33. The semiconductor device of claim 26, wherein the semiconductor material of the substrate, the buffer layer, the drift layer, the channel regions, the source layer and the gate layer comprises SiC.

34. A semiconductor device comprising:
an n-type semiconductor substrate;
a layer of n-type semiconductor material on the substrate;
a layer of p-type semiconductor material having a graded dopant concentration on the layer of n-type semiconductor material on the substrate, the layer of p-type semiconductor material having a lower surface adjacent the layer of n-type semiconductor material and an upper surface opposite the lower surface, wherein the dopant concentration in a lower portion of the layer of p-type semiconductor material adjacent the lower surface is less than the dopant concentration in an upper portion of the layer of p-type semiconductor material adjacent the upper surface;

a first ohmic contact on the upper surface of the layer of p-type semiconductor material;
a second ohmic contact on the substrate opposite the layer of n-type semiconductor material; and
a metal layer on each of the first and second ohmic contacts.

35. The semiconductor device of claim 34, wherein the layer of n-type semiconductor material on the substrate has a dopant concentration of $1 \times 10^{14}/cm^3$ to $5 \times 10^{16}/cm^3$.

36. The semiconductor device of claim 34, wherein the n-type semiconductor substrate, the layer of n-type semiconductor material on the substrate, and the layer of p-type semiconductor material comprise SiC.

37. The semiconductor device of claim 34, wherein the dopant concentration in the upper portion of the p-type layer is at least $1 \times 10^{19}/cm^3$ and wherein the dopant concentration in the lower portion of the p-type layer is less than $1 \times 10^{17}/cm^3$.

38. The semiconductor device of claim 34, wherein the substrate has a dopant concentration of at least $1 \times 10^{19}/cm^3$.

39. A method of making a semiconductor device comprising:
epitaxially growing a layer of p-type semiconductor material on a layer of n-type semiconductor material, wherein the layer of p-type semiconductor material has a lower surface adjacent the layer of n-type semiconductor material and an upper surface opposite the lower surface, wherein the dopant concentration in the layer of p-type semiconductor material is increased during epitaxial growth such that the dopant concentration in a lower portion of the layer of p-type semiconductor material adjacent the lower surface is less than the dopant concentration in an upper portion of the layer of p-type semiconductor material adjacent the upper surface, and wherein the layer of n-type semiconductor material is on an n-type semiconductor substrate;
forming a first ohmic contact on the upper surface of the p-type layer;
forming a second ohmic contact on the substrate opposite the layer of n-type semiconductor material; and
forming a metal layer on each of the first and second ohmic contacts.

40. A semiconductor device comprising:
an n-type semiconductor substrate;
a layer of n-type semiconductor material on the substrate;
a plurality of regions of p-type semiconductor material on the layer of n-type semiconductor material, the regions of p-type semiconductor material having a lower surface adjacent the layer of n-type semiconductor material, an upper surface opposite the lower surface and sidewalls, the regions of p-type semiconductor material having a graded dopant concentration wherein the dopant concentration in a lower portion of the regions of p-type semiconductor material adjacent the upper surface is less than the dopant concentration in an upper portion of the regions of p-type semiconductor material adjacent the upper surface;
regions of n-type semiconductor material on the layer of n-type semiconductor material between the plurality of regions of p-type semiconductor material, the regions of n-type semiconductor material having a lower surface adjacent the layer of n-type semiconductor material and an upper surface opposite the lower surface;
a Schottky metal layer on the upper surface of the regions of p-type semiconductor material and on the upper surface of the regions of n-type semiconductor material;
an ohmic contact on the substrate opposite the layer of n-type semiconductor material; and
a metal layer on the ohmic contact.

41. The semiconductor device of claim 40, wherein the layer of n-type semiconductor material on the substrate has a dopant concentration of $1 \times 10^{14}/cm^3$ to $5 \times 10^{16}/cm^3$.

42. The semiconductor device of claim 40, wherein the n-type semiconductor substrate, the layer of n-type semiconductor material on the substrate, and the plurality of regions of p-type semiconductor material comprise SiC.

43. The semiconductor device of claim 40, wherein the dopant concentration in the upper portion of the p-type layer is at least $1 \times 10^{19}/cm^3$ and wherein the dopant concentration in the lower portion of the p-type layer is less than $1 \times 10^{17}/cm^3$.

44. The semiconductor device of claim 40, wherein the substrate has a dopant concentration of at least $1 \times 10^{19}/cm^3$.

45. A method of making a semiconductor device comprising:
epitaxially growing a layer of p-type semiconductor material on a layer of n-type semiconductor material, wherein the layer of p-type semiconductor material has a lower surface adjacent the layer of n-type semiconductor material and an upper surface opposite the lower surface, wherein the dopant concentration in the layer of p-type semiconductor material is increased during epitaxial growth such that the dopant concentration in a lower portion of the layer of p-type semiconductor material adjacent the lower surface is less than the dopant concentration in an upper portion of the layer of p-type semiconductor material adjacent the upper surface, and wherein the layer of n-type semiconductor material is on an n-type semiconductor substrate;
selectively etching through the layer of p-type semiconductor material to form a plurality of regions of p-type semiconductor material each having an upper surface and sidewalls;
depositing n-type semiconductor material between the regions of p-type semiconductor material;
etching the n-type semiconductor material to expose the upper surfaces of the p-type regions of semiconductor material;
forming a Schottky metal layer on exposed surfaces of the p-type regions and on the n-type semiconductor material therebetween;
forming an ohmic contact on the substrate opposite the layer of n-type semiconductor material; and
forming a metal layer on the ohmic contact.

46. The method of claim 45, wherein the dopant concentration is increased in a stepped manner during epitaxial growth.

47. The method of claim 45, wherein the dopant concentration is increased continuously during epitaxial growth.

* * * * *